United States Patent [19]
Funahata et al.

[11] Patent Number: 5,561,539
[45] Date of Patent: Oct. 1, 1996

[54] COLOR LIQUID CRYSTAL DISPLAY HAVING A BENT TAPE CARRIER PACKAGE

[75] Inventors: Katsuyuki Funahata; Nobuhiro Takeda; Yoshiharu Nagae, all of Hitachi, Japan

[73] Assignee: Hitachi, Ltd., Tokyo, Japan

[21] Appl. No.: 301,005

[22] Filed: Sep. 6, 1994

[30] Foreign Application Priority Data

Feb. 13, 1992 [JP] Japan .................................... 4-026490

[51] Int. Cl.$^6$ ........................ G02F 1/1343; G02F 1/1335; G02F 1/1333
[52] U.S. Cl. ................................ 359/50; 359/66; 359/83; 359/89
[58] Field of Search .................................. 359/83, 89, 66, 359/50; 430/176

[56] References Cited

U.S. PATENT DOCUMENTS

| | | | |
|---|---|---|---|
| 4,652,932 | 3/1987 | Moyakima et al. | 359/83 |
| 4,755,035 | 7/1988 | Kopion et al. | 350/345 |
| 4,910,582 | 3/1990 | Miyamoto et al. | 257/667 |
| 5,182,660 | 1/1993 | Tanaka | 359/83 |
| 5,368,976 | 11/1994 | Tajima et al. | 430/176 |
| 5,402,255 | 3/1995 | Nakanishi et al. | 359/88 |

FOREIGN PATENT DOCUMENTS

| | | |
|---|---|---|
| 5-27229 | 2/1993 | Japan . |
| 5-66399 | 3/1993 | Japan . |
| 5-80347 | 4/1993 | Japan . |

Primary Examiner—Wael M. Fahmy
Assistant Examiner—Fetsum Abraham
Attorney, Agent, or Firm—Antonelli, Terry, Stout & Kraus

[57] ABSTRACT

The object of the invention is to provide a low-cost, high-reliability, compact, lightweight, and low-power-consumption color liquid crystal display.

To achieve the object, a liquid crystal display according to the invention comprises a backlight for applying light to a liquid crystal panel, which includes an optical plate at one side of a liquid crystal panel and a light source at the side of the optical plate to supply light to the optical plate; and a tape carrier package for liquid crystal driver including a semiconductor integrated circuit device, wherein the tape carrier package for liquid crystal driver is bent on the bent portion of the light source of the backlight.

The present invention makes it possible to realize a high-reliability bent TCP, minimize the frame of a liquid crystal display by applying the bent TCP, and realize OA equipment such as a high-reliability, compact, lightweight, and thin word processor or notebook PC superior in the portability.

17 Claims, 3 Drawing Sheets

COLOR LIQUID CRYSTAL DISPLAY HAVING A BENT TAPE CARRIER PACKAGE

BACKGROUND OF THE INVENTION

The present invention relates to a liquid crystal display, particularly to a liquid crystal display suitable for a notebook-type personal computer (hereafter referred to as a notebook PC) and a word processor (hereafter referred to as a WP) which are superior in the portability and must be compact, lightweight, thin, and of low-power-consumption.

At present, two thirds of laptop computers (hereafter referred to as laptop PCs) are notebook PCs superior in the portability. It is said that all laptop PCs become notebook PCs in several years.

As a tape carrier package (TCP) for liquid crystal driver (hereafter referred to as a TCP for liquid crystal driver) suitable for the notebook PC, a TCP for liquid crystal driver which is called a narrow TCP system, that is, a so-called slim TCP or micro TCP (hereafter referred to as a micro TCP) is proposed which has a slim filamentary liquid-crystal-driving LSI chip with 80- or 160-channel output. Moreover, this system is contrived so as to minimize the number of curvatures on a tape pattern by adjusting the bump pitch of the LSI chip to the outer lead pitch to the utmost.

However, because the aspect ratio increases in order to adjust the bump pitch of the LSI chip to the outer lead pitch, various kinds of contrivance are necessary to decrease the stress applied to the LSI chip during bonding of inner leads.

By mounting the micro TCP of this type on a liquid crystal panel, it is possible to decrease the size of periphery, that is, a so-called frame (hereafter referred to as a frame) of the liquid crystal panel and make a liquid crystal module compact, thin, and lightweight.

However, these proposed micro TCPs cannot meet market demands in view of their cost because it is necessary to further decrease the cost of the liquid crystal module for notebook PC.

Moreover, even in view of the reliability of a liquid crystal module after mounting a micro TCP on a liquid crystal panel, stress concentration on an inner lead and an input-side outer lead increases by a value equivalent to the decrease of TCP width and wiring disconnection or the like occurs.

In the case of the above prior art, no consideration is made to increase the yield for manufacturing micro TCPs including the yield for manufacturing LSI chips, the yield for manufacturing TCP tapes, and the yield for mounting LSI chips on TCP tapes. Therefore, there are limits for decreasing the costs of the micro TCP, liquid crystal module, and notebook PC and improving their reliability.

SUMMARY OF THE INVENTION

It is an object of the present invention to provide a low-cost, high-reliability, compact, light weight, and low-power-consumption liquid crystal display.

By taking advantage of the diameter of a cold-cathode tube with a large curvature used for an edge-light-type backlight constituted by setting a light source, such as a cold-cathode fluorescent tube, at the side an optical member and using a bent TCP for liquid crystal driver (hereafter referred to as a bent TCP), a high-yield high-reliability bent TCP can be realized.

By setting a light source (in general, the tube diameter of 3 to 4 mm) of a backlight under a terminal section (in general, the length of 3 to 4 mm) of a liquid crystal panel and setting a TCP for liquid crystal driver under a light guide plate along the large curvature of the light source, the bending stress at a bent portion can be minimized. Moreover, because the TCP for liquid crystal driver is set under the light leading plate by minimizing the bending stress of the TCP, it is possible to minimize the size of a frame at a high reliability.

Therefore, it is possible to make the size of a frame produced around the display of a liquid crystal panel equal to or smaller than that of the terminal of the liquid crystal panel by taking advantage of the diameter (3 to 4 mm) of a cold-cathode fluorescent tube with a large curvature to bend the TCP for liquid crystal driver.

By using the bent TCP of the present invention, a liquid crystal display with a small frame can be realized and also a compact lightweight notebook PC can be realized.

DESCRIPTION OF THE PREFERRED EMBODIMENT

A liquid crystal display using a tape-carrier-package-type liquid crystal driving LSI preferred to constitute the liquid crystal display of the present invention is described below in detail by referring to the accompanying drawings.

The tape-carrier-package-type liquid crystal driving LSI is made by mounting a liquid crystal driving LSI chip on it with a tape wired with copper foil patterns by means of the TAB (Tape Automated Bonding) technique.

The external view and structure of a tape-carrier-package-type liquid crystal driver used for the liquid crystal display of the present invention is described below by referring to FIGS. 1 and 2.

Figure 1:
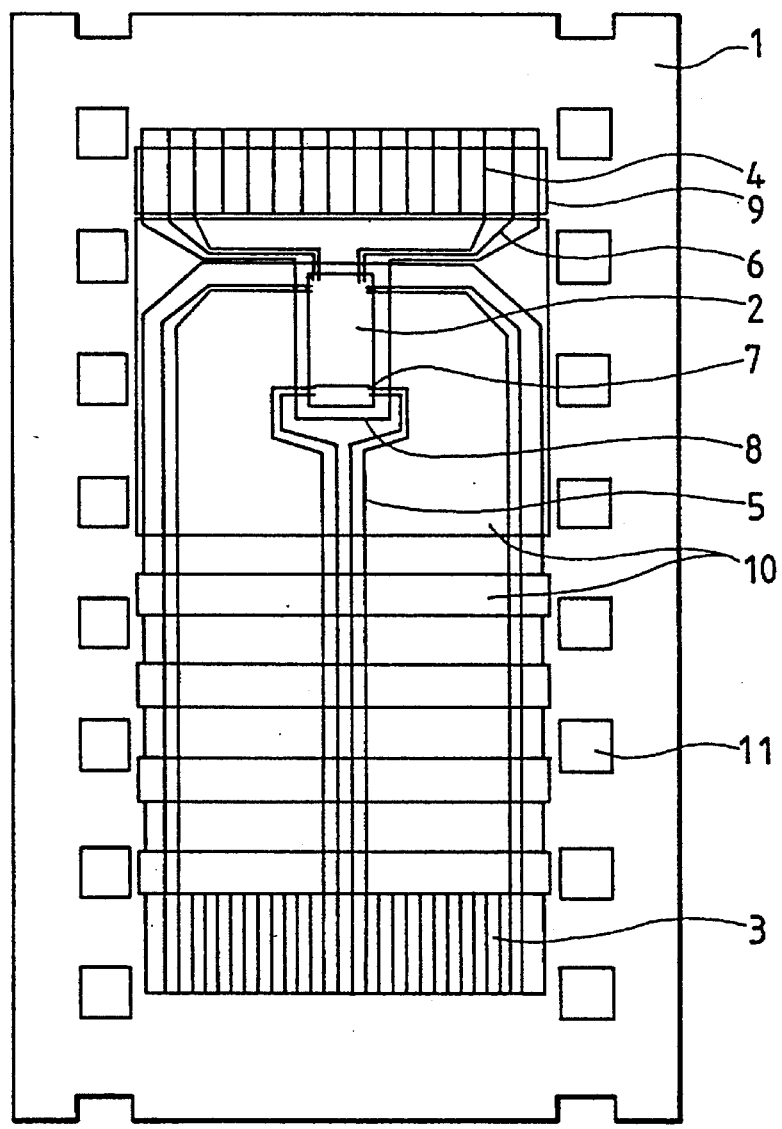
FIG. 1 is an external view of a TCP for liquid crystal driver used for the liquid crystal display of the present invention.

FIG. 1 shows an external view of the tape-carrier-package-type liquid crystal driver. In FIG. 1, numeral 1 represents a base tape, 2 represents an LSI chip, 3 represents an output-side outer lead, 4 represents an input-side outer lead, 5 represents output-side wiring, 6 represents input-side wiring, 7 represents an inner lead, 8 represents a device hole, 9 represents an input-side outer lead hole, 10 represents solder resist, and 11 represents a sprocket hole (or perforation).

As shown in FIG. 1, the base tape 1 is made by arranging patterns on a 35 mm-wide polyimide film at 12-perforation pitch. Patterns are arranged so that the outer leads 3 and 4 are vertical to the sprocket hole 11. That is, because an extremely large stress is applied to the vicinity of the sprocket hole 11 when manufacturing a tape carrier, the outer leads 3 and 4 requiring a high dimensional accuracy are not arranged around the sprocket hole 11 but they are arranged in a direction different from the stress direction so that the accumulated dimensional tolerance of the outer leads 3 and 4 is minimized.

Figure 2:
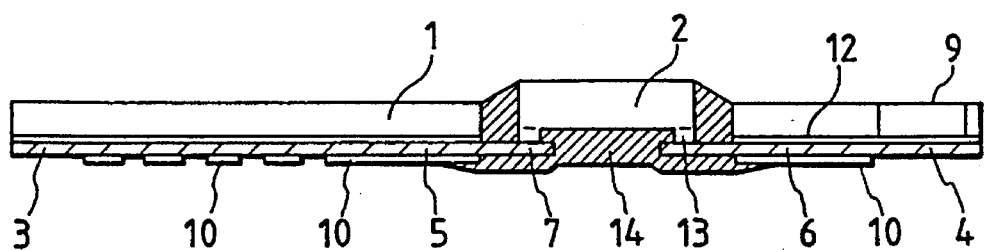
FIG. 2 is a sectional view of a TCP for liquid crystal driver used for the liquid crystal display of the present invention.

FIG. 2 shows the sectional structure of a TCP for liquid crystal driver used for the liquid crystal display of the present invention, In FIG. 2, symbol 1 represents a base tape, 2 represents an LSI chip, 3 represents an output-side outer lead, 4 represents an input-side outer lead, 5 represents output-side wiring, 6 represents input-side wiring, 7 represents an inner lead, 9 represents an outer lead hole, 10 represents solder resist, 12 represents adhesive, 13 represents a bump, and 14 represent sealing compound.

As shown in FIG. 2, the TCP for liquid crystal driver of the liquid crystal display of the present invention has a three-layer structure, that is, a structure comprising the base tape 1, the adhesive 12, and the copper foil patterns 3, 4, 5, 6, and 7.

Because the TCP for liquid crystal driver is a structure of various materials, there are several combinations. This embodiment uses the most popular combination in which the base tape 1 uses a polyimide-based film (Kapton V, Upilex S, SS) with the thickness of 75 μm, the adhesive 12 uses epoxy-based adhesive, the wiring materials 3, 4, 5, 6, and 7 use a copper foil (rolled copper foil, electrolytic copper foil) with the thickness of 35 μm, the sealing compound 14 uses epoxy-based resin, and the solder resist 10 uses epoxy-based solder resist, and the outer leads 3, 4, 5, 6, and 7 are plated with solder.

In the case of this embodiment, the outer leads 3, 4, 5, 6, and 7 are plated with solder. However, it is possible to plate the leads with tin or gold. Therefore, it is necessary to determine a material for plating the leads by considering the reliability of the wiring pitch or chemical migration of the outer leads 3, 4, 5, 6, and 7.

Moreover, this embodiment uses a tape having a three-layer structure, that is, it comprises the base tape 1, adhesive 12, and copper foil patterns 3, 4, 5, 6, and 7. However, it is clear that the dimensional accuracy and various reliabilities are improved by using a tape having a two-layer structure comprising the base tape 1 and copper foil patterns 3, 4, 5, 6, and 7 without using the adhesive 12.

Figure 3:
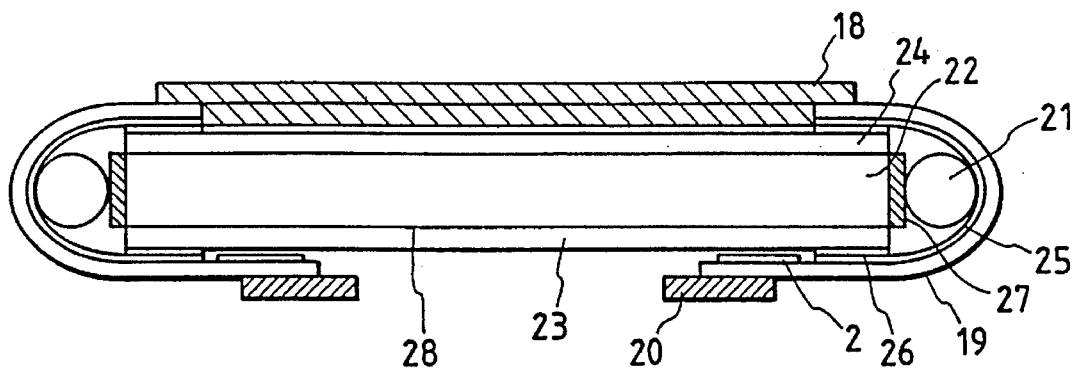
FIG. 3 is a block diagram of the liquid crystal display of the present invention.

FIG. 3 shows the structure of a color liquid crystal display using the above TCP for liquid crystal driver. In FIG. 3, symbol 2 represents a liquid crystal driver LSI chip, 18 represents a liquid crystal panel, 19 represents the above mentioned bent TCP, 20 represents a printed circuit board, 21 represents a cold-cathode fluorescent tube, 22 represents an optical member, 23 represents a reflection sheet, 24 represents a diffusion sheet, 25 represents a reflection sheet for lamp, 26 represents a double-sided adhesive tape, 27 represents a lamp guide, and 28 represents a white reflection film.

In FIG. 3, the liquid crystal panel 18 uses a super TN color liquid crystal panel or a TFT (Thin Film Transistor) color liquid crystal panel. Moreover, the backlight uses the cold-cathode fluorescent tube 21 with the diameter of 3 mm, the optical member 22 uses an acrylic plate with the thickness of 3 mm, the reflector sheet 23 uses a polyester sheet with the thickness of 0.125 mm, the diffusion sheet 24 uses a polyester sheet with the thickness of 0.1 mm, the reflector sheet for lamp 25 uses a polyester sheet with the thickness of 0.125 mm vacuum-deposited with sliver, the double-sided adhesive tape 26 uses nonwoven fabric covered with acrylic-based adhesive, the lamp guide 27 uses silicon rubber, and the white reflector film 28 uses polyester-base ink mainly containing titanium oxide or acrylic-base ink mainly containing titanium oxide.

As shown in FIG. 3, it is possible to minimize the stress applied to the inner lead of the TCP 19 for liquid crystal driver by setting the TCP 19 under the light leading body 22 by taking advantage of the large radius of curvature of the cold-cathode fluorescent tube 21. Therefore, a frame can be downsized and moreover a liquid crystal display with a high reliability can be realized.

To minimize the stress applied to the inner lead of the TCP 19 for liquid crystal driver use, solder resist is not entirely formed on the bent portion of the TCP 19 for liquid crystal driver but arranged on it like stripes at a specific pitch in parallel with the cold-cathode fluorescent tube.

Moreover, to minimize the stress applied to the inner lead of the TCP 19 for liquid crystal driver use, the thickness of the base tape 1 and the copper foils 3, 4, 5, 6, and 7 may be decreased. In this method, however, it is necessary to reinforce the sprocket by lining it with a copper foil or improve the mechanical strength of the copper foil by alloying it.

As shown in FIG. 3, to set the TCP 19 for liquid crystal driver under the backlight by taking advantage of the diameter of the cold-cathode fluorescent tube 21 to bend the TCP, it is mounted at a position approx. 5 mm apart from the end of the liquid crystal panel 18. Moreover, the thin backlight comprising the liquid crystal panel 18, cold-cathode fluorescent tube 21, and light guide plate 22 is integrated with a metallic frame with the thickness of 0.5 mm. By using the above constitution, it is possible to realize a color liquid crystal display for notebook PC with the module thickness of approx. 8 mm, module weight of approx. 500 g, and power consumption of approx. 4 W.

Figure 4:
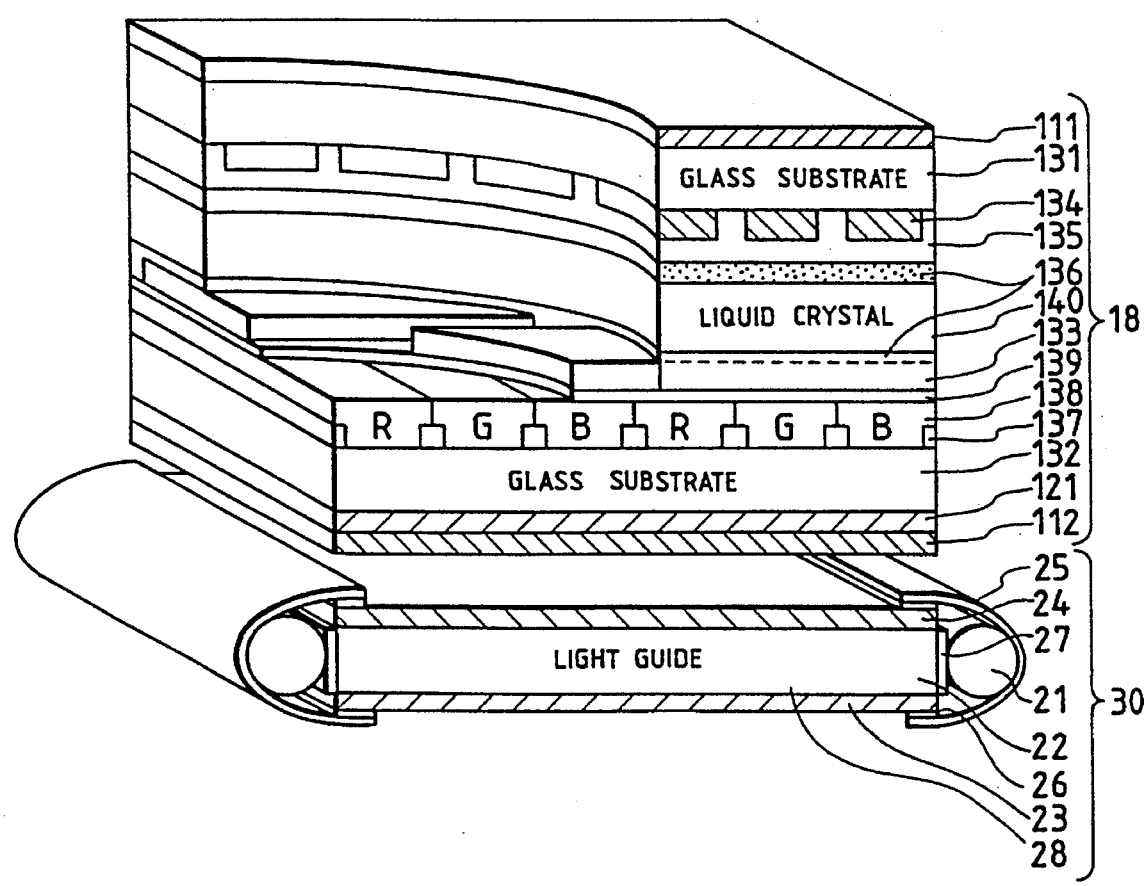
FIG. 4 is a sectional view of the liquid crystal display shown in FIG. 3.

FIG. 4 shows the constitution of a color liquid crystal display for notebook PC using a super TN color liquid crystal panel for the above TCP 19 for liquid crystal driver and the liquid crystal panel 18. The liquid crystal panel 18 shown in FIG. 4 is a display having the display scale of 640(×3)×400 dots (picture element pitch: 0.27 mm×0.27 mm, picture element size: 0.255 mm×0.255 mm, and screen diagonal size: 8.0 in), which comprises top and bottom electrode substrates (material: soda lime glass, thickness: 0.7 mm) 131 and 132, liquid crystal 140, a double-refractive film (NITTO DENKO CORP. make: uniaxial oriented polycarbonate film) 121, and top and bottom polarizing plates (NITTO DENKO CORP. make: G1220DU, transmittance: 40%) 111 and 112. On the bottom electrode substrate 132, the following are formed: a black matrix (pigment type, thickness: 0.7 to 1.3 μm) 137, a color filter (pigment type, thickness: 1.5 to 2.5) 138, a smoothing film (epoxy-based resin, thickness: 0.7 to 1.3 μm) 139, a bottom transparent electrode (ITO, sheet resistivity: 15 Ω/□) 133, and an orientation film (polyimide-base resin, thickness; 0.07 to 0.13 μm) 136. On the top electrode substrate 131, the following are formed: a top transparent electrode (ITO, sheet resistivity: 15 Ω/□) 134, an insulating film (material: SiO2, thickness: 0.07 to 0.13 μm) 135, and an orientation film 136.

The orientation films 136 on the top and bottom electrode substrates 131 and 132 are rubbed to form a spiral structure so that the liquid crystal (mixed purity of a pigment dispersion panel of a color filter liquid crystal made by Merck, liquid crystal layer thickness: 6 μm) 140 twists by 260 degrees between the top and bottom electrodes 131 and 132.

Moreover, the double-refractive film 121 and the bottom polarizing plate 112 are arranged at the side opposite to the side where the color filter 138 is formed on the bottom electrode substrate 132 and the top polarizing plate 111 is arranged at the side opposite to the side where the top electrode 134 is formed on the top electrode substrate 131. FIG. 4 shows the constitution in which the color filter is formed on the bottom electrode substrate 132 with less number of electrodes because of the easiness of electrode forming. However, in view of the easiness of liquid crystal panel assembling, it is more advantageous to form the color filter on the top electrode substrate.

The liquid crystal display comprises the above liquid crystal panel 18 and a thin backlight unit 30 consuming less power. The backlight unit 30 comprises an optical member (material: acrylic, thickness: 3 mm) 22, a cold-cathode fluorescent tube (Matsushita K-C240T4E72, tube diameter: 4 mm) 21, a reflector sheet (DAIYA HOIRU W-400, thickness: 0.125 mm) 25, a diffusion sheet (KIMOTO D-204, thickness: 0.1 mm) 24, a reflector sheet for cold-cathode fluorescent tube (KIMOTO GR-38W, thickness: 0.1 mm) 25, a double-sided adhesive tape (NITTO DENKO CORP. No. 500) 26, a guide for cold-cathode fluorescent tube (silicon rubber) 27, and a white reflection film (dispersant: titanium oxide, base material: polyester resin) 28.

A pigment-dispersion-type black matrix (width: 25 μm) 137 formed by the photolithography is arranged on the bottom electrode substrate 112 at the pitch of 90 μm and a pigment-dispersion-type color filter 138 formed by the printing method is arranged on the black matrix 137.

The color filter 138 is made by dispersing organic or inorganic pigment in melamine-epoxy resin, whose film thickness is 1.5 to 2.5 μm. The black matrix 137 is made by mainly dispersing carbon in acrylic resin, whose film thickness is 0.7 to 1.3 μm in order to decrease the transmittance to 2% or less.

The pigment-type black matrix 137 makes it possible to greatly decrease the light reflected from the surface of a liquid crystal panel compared with a color liquid crystal display using a black matrix made of a chromium film (thickness: approx. 0.1 μm).

In the case of this embodiment, the color filter 138 is formed under the transparent electrode 134 at the bottom substrate side by the printing method because of the advantageousness of formation of the electrodes 133 and 134 and the black matrix is formed by the photolithography. It is possible to provide a more inexpensive color liquid crystal panel by forming the black matrix by the printing method.

To form the black matrix by printing, it is necessary to form an accurate superimposition mark so that an accuracy of superimposition between the black matrix and the bottom electrode to be formed on the color filter is obtained or contrive the superimposition mark so that an accuracy equal to the above superimposition accuracy is obtained. That is, to form the color filter on the bottom electrode, the above superimposition mark and alignment between the color filter formed under the bottom electrode and the top electrode are important points. In this case, the bottom electrode can easily be aligned with the top electrode by forming the color filter under the top electrode.

In the liquid crystal display of the present invention, the thickness and uniformity of a liquid crystal layer are important factors for controlling such display characteristics as the brightness, contrast, and color specification range. To uniform the thickness of the liquid crystal layer, it is desirable to form the color filter at the same smoothness as that of the top and bottom electrode substrates.

The liquid crystal display of the present invention makes it possible to use a backlight having a structure in which a fluorescent tube is set at the side of an optical member by specifying the dispersion rate and spectral transmittance characteristic of the pigment of a color filter so that three characteristics of smoothness, color purity, and transmittance are well balanced. Therefore, a thin, light weight, and low-power-consumption liquid crystal display is realized.

For the liquid crystal display of the present invention, the pigment-dispersion-type color filter 138 formed by printing is a point. The dispersion rate of the pigment of the color filter is optimized through experiments by considering the balance of the three characteristics of smoothness, color purity, and transmittance of the color filter 138.

Figure 5:
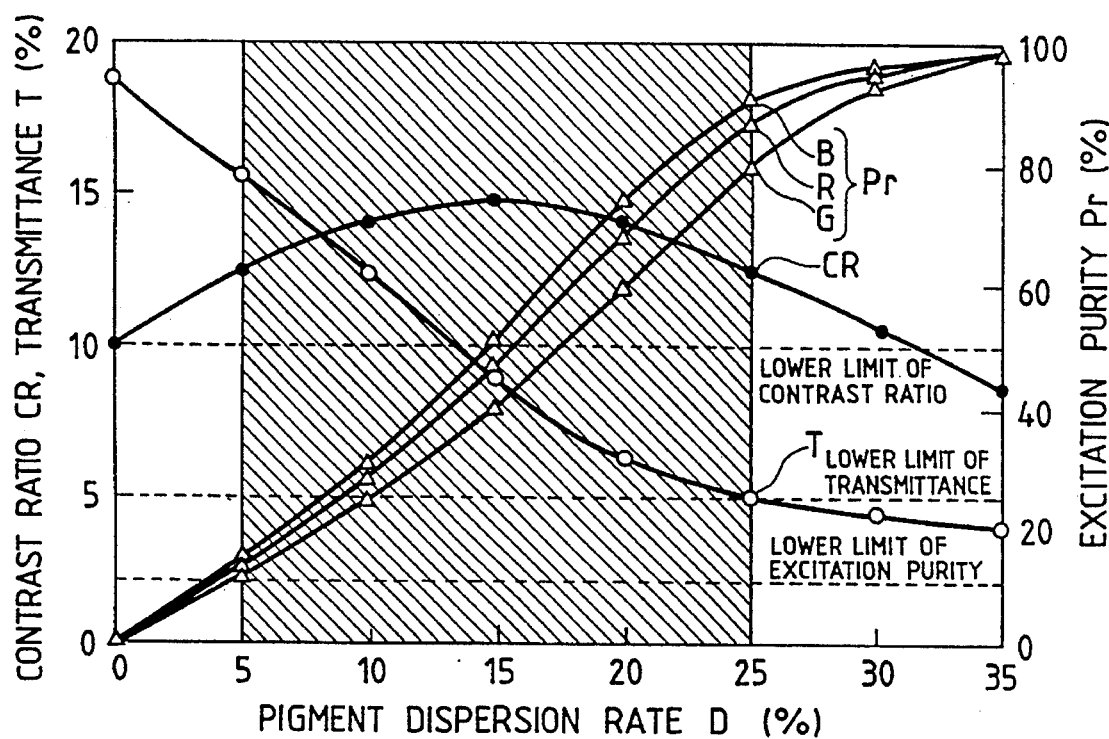
FIG. 5 is a diagram showing the relation between the transmittance, contrast ratio, and excitation purity of a pigment dispersion panel of a color filter used for the liquid crystal display shown in FIG. 4.

FIG. 5 shows the relation between dispersion rate, transmittance, contrast ratio, and excitation purity of pigment. As shown in FIG. 5, by setting the transmittance T to 5%, the contract ratio Cr to 10, and the excitation purity Pr to 10%, it is found that it is necessary to set the range of the pigment dispersion rate between 5 and 25%. In this case, however, it is important to specify the color filter thickness between 1.5 and 2.5 μm. That is, the spectral transmittance characteristic of the color filter is determined by the product of the pigment dispersion rate and the color filter thickness.

When considering the three display characteristics of brightness, contrast, and color specification range and the balance between module thickness and power consumption, it is necessary to specify the pigment dispersion rate between 8 and 23% and the color filter thickness between 1.7 and 2.3 μm. Therefore, this embodiment uses the color filter 138 in which the pigment dispersion rate is set to approx. 15%.

Figure 6:
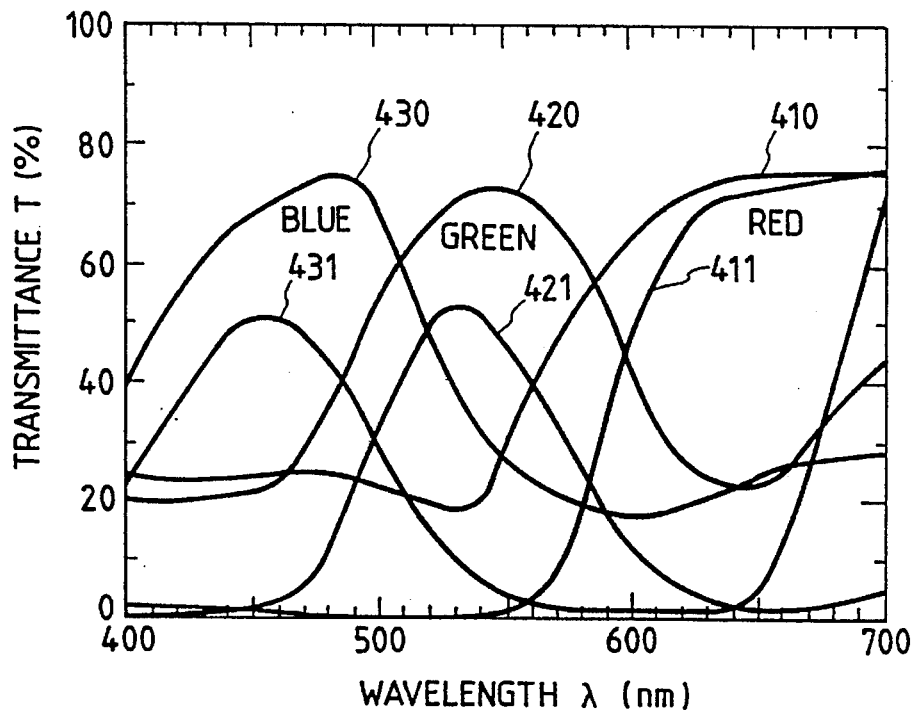
FIG. 6 is a spectral transmittance characteristic diagram of a color filter used for the liquid crystal display shown in FIG. 4.

FIG. 6 shows the spectral transmittance characteristic of the color filter 138 in which the pigment dispersion rate is specified as approx. 15%, the color filter thickness as approx. 2 μm and the spectral transmittance characteristic of an existing color filter used for a lap-top-type personal computer, in which the pigment dispersion rate is specified as approx. 30% and the color filter thickness as approx. 2 μm. In FIG. 6, symbols 410 and 411 represent spectral characteristics of red, 420 and 421 represent spectral characteristics of green, and 430 and 431 represent the spectral characteristics of blue. Symbols 410, 420, and 430 represent color filters in which the pigment dispersion rate is specified as approx. 15% and 411, 421, and 431 represent color filters in which the pigment dispersion rate is specified as approx. 30%. As shown in FIG. 6, a point is that the transmittance of the color filter is improved by increasing the transmittance in wavelength areas other than the expected color though it is hitherto decreased and the smoothness of the color filter is also increased up to approx. three times larger than the existing one.

However, the excitation purity of the color filter of the present invention is slightly smaller than that of the existing color filter with the pigment dispersion rate of approx. 30% used for a laptop computer. Therefore, the color filter of the color liquid crystal display of the present invention is light-colored compared with the existing color filter.

To use the light-colored color filter, it is important to change the spectral transmittance characteristic to the characteristic considering the white balance of only the color filter or the white/black balance in the combination of the liquid crystal panel 18 and the backlight unit 30 in the module constitution shown in FIG. 1.

The color liquid crystal display using a super TN color liquid crystal panel for the liquid crystal panel 18 is described above.

In the color liquid crystal display of the present invention, it is possible to use a TFT color liquid crystal panel for the liquid crystal panel 18. The TFT color liquid crystal panel is constituted of liquid crystal between a TFT substrate, on which TFTs and pixel electrodes are arranged at intersections of scanning electrodes and signal electrodes, and another substrate, on which facing electrodes, color filters and a black matrix.

As described above, it is possible to realize a compact, lightweight, and low-power-consumption liquid crystal display by combining the above TOP for liquid crystal driver with a liquid crystal panel using a light-colored color filter.

It is possible to constitute OA equipment such as a word processor or notebook PC by combining the liquid crystal display of the present invention with an information input unit such as a keyboard or touch panel, and arithmetic unit for computing inputted information, an arithmetic program for performing arithmetic, or a memory for storing arithmetic results.

According to the present invention, a bent TCP with a high reliability can be realized. Moreover, by using the bent TCP, it is possible to minimize the frame of a liquid crystal display and realize an information processor such as a compact, lightweight, and thin WP or notebook PC superior in the portability and reliability.

What is claimed is:

1. A liquid crystal display, comprising:
   an optical plate having a main surface and opposed sides;
   a liquid crystal panel overlying the main surface of the optical plate;
   a light source next to a side, of the opposed sides, of said optical plate, to admit light to said optical plate; and
   a tape carrier package, for a liquid crystal driver having a semiconductor integrated circuit device, wherein said tape carrier package is positioned along said light source so as to be bent thereon.

2. The liquid crystal display according to claim 1, wherein the liquid crystal panel is a super TN color liquid crystal panel or a TFT liquid crystal panel.

3. The liquid crystal display according to claim 1, wherein the light source is a cold-cathode fluorescent tube.

4. The liquid crystal display according to claim 1, wherein the tape carrier package has a device hole for mounting the semiconductor integrated circuit device.

5. The liquid crystal display according to claim 1, wherein the tape carrier package includes a wiring portion between the semiconductor integrated circuit device and an output-side outer lead, and wherein solder resist is locally formed on the wiring portion.

6. The liquid crystal display according to claim 5 wherein then solder resist is locally formed on the wiring portion between the semiconductor integrated circuit device and an output-side outer lead in the shape of stripes in parallel with the output-side outer lead.

7. The liquid crystal display according to claim 1, wherein the light source has a bent portion, and the tape carrier package is bent so as to conform to a shape of said bent portion of the light source.

8. The liquid crystal display according to claim 7, wherein said bent portion of the light source is a curved portion.

9. The liquid crystal display according to claim 1, wherein the tape carrier package extends to a location adjacent a surface of the optical plate opposite the main surface of the optical plate.

10. The liquid crystal display according to claim 1, wherein the tape carrier package has a laminate structure of at least a base tape and copper foil patterns.

11. The liquid crystal display according to claim 10, wherein the light source extends in a direction, and the tape carrier package has a bent part so as to conform to the shape of the bent portion of the light source, and wherein the tape carrier package has a solder resist on said bent part, the solder resist on the bent part being in a form of stripes extending in the direction that the light source extends.

12. The liquid crystal display according to claim 1, wherein said tape carrier package has a rectangular shape having longitudinal sides longer than sides transverse to the longitudinal sides, wherein the tape carrier package is provided with a semiconductor integrated circuit device, the semiconductor integrated circuit device having inner leads and output leads, and wherein a direction from the inner leads to the output leads is parallel to the longitudinal sides of the tape carrier package.

13. A liquid crystal display, comprising:
    a pair of substrates;
    a liquid crystal layer interposed between said pair of substrates; and
    a color filter formed on one substrate of said pair of substrates,
    wherein said color filter is a pigment-dispersed color filter, and has a thickness of 1.5 to 2.5 μm and a pigment dispersion rate of larger than 9% to not more than 25%.

14. The liquid crystal display according to claim 13, further comprising a black matrix formed on said one substrate, the black matrix being a pigment black matrix, the black matrix having a film thickness of 0.7 to 1.3 μm and wherein light transmittance therethrough is at most 2%.

15. The liquid crystal display according to claim 14, wherein the black matrix is a black matrix formed by printing.

16. The liquid crystal display according to claim 13, wherein the pigment dispersion rate is 15%–25%.

17. An information processor, comprising:
    an information input unit for inputting information;
    an arithmetic unit for computing inputted information;
    a memory for storing an arithmetic program for performing arithmetic and arithmetic results; and
    a liquid crystal display which includes:
      an optical plate having a main surface and opposed sides;
      a liquid crystal panel overlying the main surface of the optical plate;
      a light source next to a side, of the opposed sides, of said optical plate, to admit light to said optical plate; and
      a tape carrier package, for a liquid crystal driver having a semiconductor integrated circuit device, wherein said tape carrier package is positioned along said light source so as to be bent thereon

* * * * *